United States Patent
Ryu et al.

(10) Patent No.: US 6,858,907 B2
(45) Date of Patent: Feb. 22, 2005

(54) METHOD OF FABRICATING SEMICONDUCTOR DEVICE HAVING NOTCHED GATE

(75) Inventors: Hyuk-Ju Ryu, Guri (KR); Young-Gun Ko, Seoul (KR)

(73) Assignee: Samsung Electronics Co., Ltd. (KR)

( * ) Notice: Subject to any disclaimer, the term of this patent is extended or adjusted under 35 U.S.C. 154(b) by 93 days.

(21) Appl. No.: 10/114,214

(22) Filed: Apr. 2, 2002

(65) Prior Publication Data

US 2002/0142523 A1 Oct. 3, 2002

(30) Foreign Application Priority Data

Apr. 3, 2001 (KR) .......................................... 2001-17695

(51) Int. Cl.[7] .............................................. H01L 21/02
(52) U.S. Cl. ....................... 257/412; 257/410; 257/411; 438/169; 438/43; 438/494
(58) Field of Search ................................ 257/382, 384, 257/387, 388, 413; 438/300, 595, 286, 197, 299, 303

(56) References Cited

U.S. PATENT DOCUMENTS

| | | | | |
|---|---|---|---|---|
| 5,851,890 A | * | 12/1998 | Tsai et al. .................... | 438/303 |
| 6,110,783 A | * | 8/2000 | Burr ............................ | 438/286 |
| 6,204,133 B1 | * | 3/2001 | Yu et al. ...................... | 438/299 |
| 6,399,469 B1 | * | 6/2002 | Yu ............................... | 438/595 |
| 6,506,649 B2 | * | 1/2003 | Fung et al. ................... | 438/300 |
| 6,528,363 B2 | * | 3/2003 | Ku et al. ...................... | 438/197 |
| 6,541,320 B2 | * | 4/2003 | Brown et al. ................ | 438/197 |
| 2002/0132431 A1 | * | 9/2002 | Fung et al. ................... | 438/300 |

* cited by examiner

*Primary Examiner*—Nathan J. Flynn
*Assistant Examiner*—Fazli Erdem
(74) *Attorney, Agent, or Firm*—Mills & Onello LLP

(57) ABSTRACT

A semiconductor device includes: a silicon substrate; a source/drain region formed in the substrate including a lightly doped region and an adjacent heavily doped region, the depth of the heavily doped region being greater than the depth of the lightly doped region; a gate oxide layer on the silicon substrate; and a notched gate electrode on the substrate, the notched gate electrode including a notch along an outer side surface of a lower portion such that a top portion of the notched gate electrode is wider than the lower portion, the gate oxide layer extending between the interface of the notched gate electrode and the substrate, and a gate poly oxide layer provided along an outer side surface of the notched gate electrode and along an inner wall of the notch, a portion of the lightly doped region being under the notch.

19 Claims, 4 Drawing Sheets

METHOD OF FABRICATING SEMICONDUCTOR DEVICE HAVING NOTCHED GATE

BACKGROUND OF THE INVENTION

1. Field of the Invention

The present invention relates to a method for fabricating a semiconductor device having a notched gate, and more particularly, to a method for fabricating a semiconductor device having a notched gate wherein the semiconductor device is capable of forming a shallow junction through a low-energy ion implantation process, while maintaining reliability in an oxide gate.

2. Description of the Related Art

When a semiconductor device is fabricated on a silicon substrate, an electric field of high strength is generated in an interface, or junction, region between a doping region and a channel region doped with high-density impurity on the bottom of a gate electrode of the substrate. Such an electric field of high strength continuously causes hot carriers to flow in the direction of the gate electrode, particularly at the bottom of the gate oxide layer, exposing the thin and weak gate oxide layer of about 40 to 100 Å in thickness to possible damage.

To address this issue, a lightly doped drain LDD region is fabricated between the highly doped drain region and the channel region on the substrate. Such an LDD region provides a transition region between the highly doped drain and the channel region to lower the strength of the electric field generated in the adjacent channel region and the gate oxide layer, and therefore decreases the flow of hot carriers generated by the electric field.

Referring to FIG. 1, in the conventional approach an LDD region 104 is formed including a gate electrode 110 and an isolation region of a field oxide 102 on the silicon substrate 100. Field oxide regions 102 are separately located on both sides of the gate electrode 110. A source or a drain region 106 is respectively formed between the gate electrode 110 and the field oxide 102.

In doping an impurity on the silicon substrate 100 to fabricate a source/drain region 106, the substrate 100 generally forms an LDD region 104 with a lightly doped impurity. The lightly doped substrate, for example including approximately $5 \times 10^{13}$ B atom/cm$^2$, forms a P-well in the negatively doped substrate, and the lightly doped substrate, for example with about $5 \times 10^{13}$ As atom/cm$^2$, forms an N-well in the positively doped substrate.

After depositing an oxide layer on the gate electrode 110, the oxide layer is etched anisotropically to form an oxide spacer 113 at the side walls of the gate electrode 110. A deep source/drain implanting process fabricates the highly doped source/drain region (N+ well or P+ well, 106) in the substrate 100 exposed between the oxide spacer (a gate spacer, 113) and the isolation layer of the field oxide 102.

Such an LDD region can eliminate the problem of hot carriers, but this approach can also result in deterioration of the gate oxide layer 111. Additionally, the resistance of the LDD region is higher than a comparable highly doped region because lighter dopant levels in the LDD region reduces electrical conductivity in the silicon substrate.

Such high resistance in the current passage between the source and drain regions deteriorates performance of the semiconductor device, even in the case of lower source voltages in the range of 2 to 3 V. Application of ever-lower voltages to integrated circuits adopted in portable computers such as a laptop computer remains an important design consideration. Therefore, it is not generally acceptable that the performance of the semiconductor device, including the LDD region, is deteriorated with the application of lower voltages.

It is therefore preferable that high-strength electric fields and hot carriers between the channel region and the highly doped drain region on the substrate be avoided, without increasing the resistance of the conventional LDD region.

In addition, as transistors of ever-smaller scale are developed, for example less than 0.1 μm, mitigation of a phenomenon referred to as the short channel effect (SCE) becomes an increasingly important consideration. To improve performance of the semiconductor device and to solve the above described problem, others have fabricated a shallow junction by utilizing a low energy implantation process. The conventional dry etching process forms a gate polysilicon layer 112 after the gate polysilicon layer 112 is deposited, and grows a gate poly oxide layer 114 to cure plasma damage to the gate polysilicon layer 112 during the dry etching process.

However, when a source/drain ion implanting process is applied through the gate poly oxide layer 114, the resistance in the source/drain region becomes higher because most of the dopants reside in the gate poly oxide layer 114. This can especially occur when the source/drain ion implanting process is a low energy ion implanting process. It is therefore desirable to ensure reliability of the gate electrode 110, without increasing resistance in the source/drain region.

SUMMARY OF THE INVENTION

To overcome the above described problems, the present invention provides a semiconductor device capable of forming a shallow junction by a low energy ion-implanting process while maintaining reliability of the gate electrode, while reducing gate capacitance according to the reduction of gate length by forming a notched gate, and while reducing an overlap capacitance between the gate and the source/drain extension.

The present invention further provides a method of fabricating the semiconductor device, by forming a notched shape in the bottom of the gate polysilicon layer, by growing a gate poly oxide layer, by dry etching a portion of the gate poly oxide layer, and by performing a low energy ion-implanting process.

In order to achieve the above object, the present invention is directed to a semiconductor device comprising: a silicon substrate; a source/drain region formed in the substrate including a lightly doped region and an adjacent heavily doped region, the depth of the heavily doped region being greater than the depth of the lightly doped region; a gate oxide layer on the silicon substrate; and a notched gate electrode on the substrate, the notched gate electrode including a notch along an outer side surface of a lower portion such that a top portion of the notched gate electrode is wider than the lower portion, the gate oxide layer extending between the interface of the notched gate electrode and the substrate, and a gate poly oxide layer provided along an outer side surface of the notched gate electrode and along an inner wall of the notch, a portion of the lightly doped region being under the notch.

In one embodiment, a gate spacer is provided adjacent the gate poly oxide layer of the notched gate electrode. The interface of the lightly doped region and the heavily doped region can be positioned under an outer edge of the spacer.

The lightly doped region can extend to a location under the outer side surface of the top portion of the gate electrode, or can extend under the notch.

The notched gate electrode can be formed of gate polysilicon. The width of the lower portion of the gate electrode is preferably in the range of about 5 to 50% of the width of the top portion of the gate electrode.

The gate oxide layer may comprise, for example, silicon oxide $SiO_2$, silicon nitro-oxide $SiN_xO_y$, zirconium oxide $ZrO_2$, hafnium oxide $HfO_2$, tantalum oxide $Ta_2O_5$, or aluminum oxide $Al_2O_3$. Alternatively, the gate oxide layer may comprise a silicon nitride layer $Si_3N_4$ or a silicon oxi-nitride layer $SiO_xN_y$.

The semiconductor device of the present invention may be used for forming a transistor having a pattern size of less than 1 μm. The resulting transistor may be provided on a silicon on insulator SOI structure.

In another aspect, the present invention is directed to a method of fabricating a semiconductor device, comprising the steps of: sequentially providing a gate oxide layer and a gate polysilicon layer on a silicon substrate; etching a notched gate electrode in the gate polysilicon layer by applying an etching condition so as to increase a selectivity ratio in the gate oxide layer, the notched gate electrode including a notch along an outer side surface of a lower portion such that a top portion of the notched gate electrode is wider than the lower portion; providing a gate poly oxide layer on the top portion and outer side surface of the notched gate electrode and on the substrate; removing a portion of the gate poly oxide layer except for a portion of the outer side surface in the region of the notch; forming a lightly doped drain LDD region by applying a low energy first ion implanting process; forming a gate spacer adjacent the gate poly oxide layer; and forming a deeply doped region by applying a second ion implanting process to provide a deep source/drain region.

An etching condition adjustment may be performed by partitioning the step of etching into a plurality of etching steps. Each of the plurality of etching steps may employ different etching chemical mixtures to form the notched gate electrode. Portions of the lower portion of the gate electrode and the gate oxide layer may be dry-etched by an etching chemical mixture including an oxygen ion $O^{2-}$, $O^-$ or $O^*$.

BRIEF DESCRIPTION OF THE DRAWINGS

For a more complete understanding of the present invention and the advantages thereof, reference is now made to the following description taken in conjunction with the accompanying drawings, in which like reference numerals denote like parts, and in which.

DETAILED DESCRIPTION OF PREFERRED EMBODIMENTS

Reference is now made in detail to preferred embodiments of the present invention, an example of which is illustrated in the accompanying drawings.

Initially, an isolation layer of a field oxide and a channel ion implanting process are generally applied to a silicon substrate. The channel ion implanting process is performed to fabricate a lightly doped drain LDD region.

Figure 1:
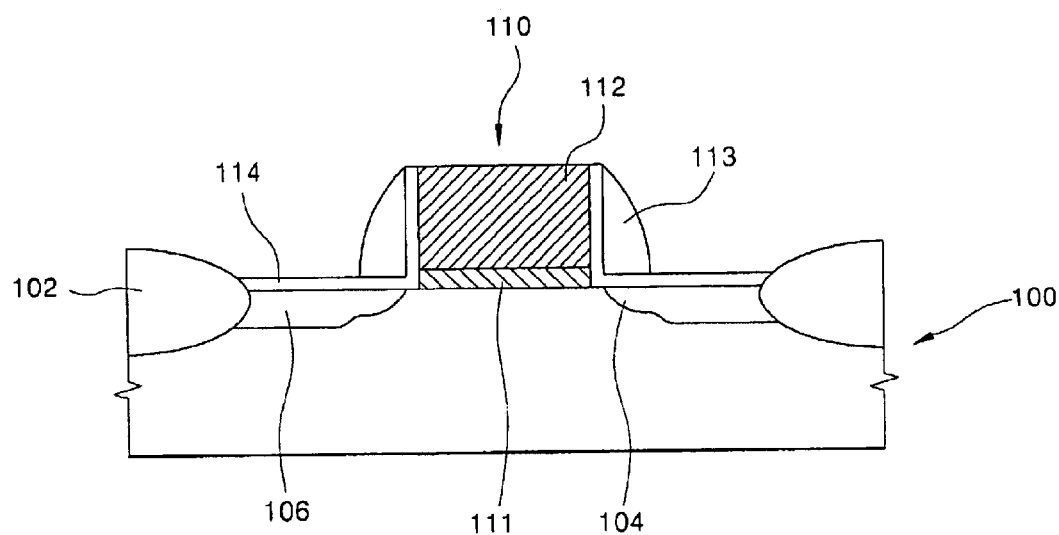
FIG. 1 is a cross sectional diagram illustrating a conventional semiconductor device.
Figure 2:
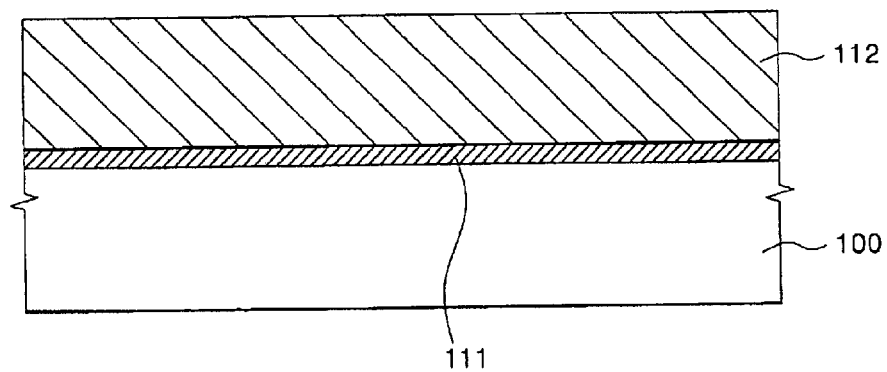
FIG. 2–FIG. 8 are cross sectional diagrams illustrating a method of fabricating a semiconductor device according to the preferred embodiment of the present invention.

Referring to FIG. 2, a gate oxide layer 111 and a gate polysilicon layer 112 are fabricated on the silicon substrate 100. The gate oxide layer may be formed of a material comprising, for example, silicon oxide $SiO_2$, silicon oxi-nitride $SiO_xN_y$, zirconium oxide $ZrO_2$, hafnium oxide $HfO_2$, tantalum oxide $Ta_2O_5$, or aluminum oxide $Al_2O_3$. Silicon nitride $Si_3N_4$ may alternatively be used. Silicon oxide $SiO_2$ is preferred.

Figure 3:
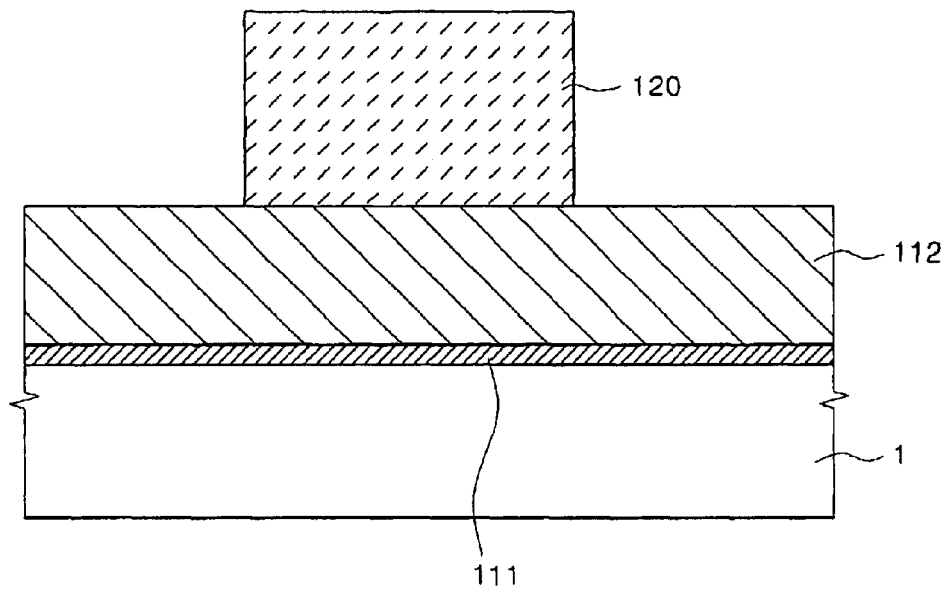

Referring to FIG. 3, a photoresist 120 is coated on the gate polysilicon layer 112, and developed to from a pattern.

Figure 4:
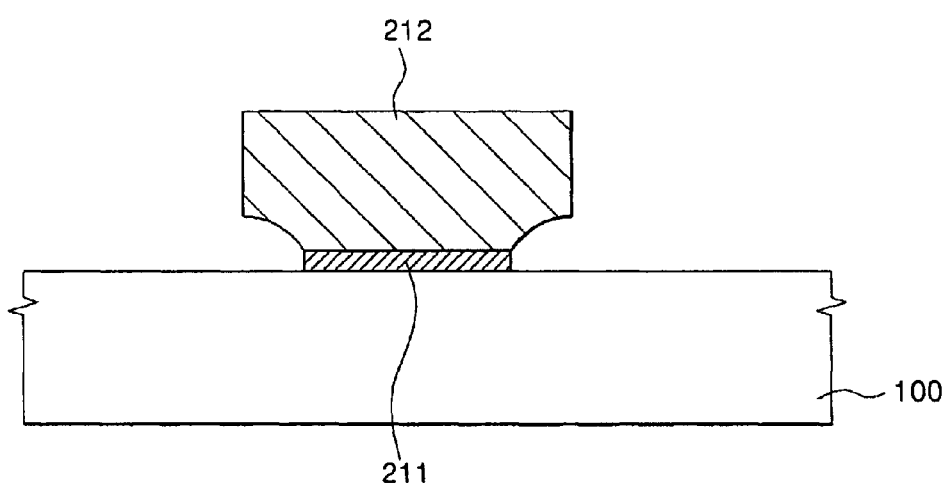

Referring to FIG. 4, after patterning the photoresist 120, the gate polysilicon layer 112 is dry-etched. Unlike a normal dry etching process, etching conditions are adjusted during the over etching step, namely, the late terms of the dry etching process, such that the selectivity ratio of the oxide layer is increased. Therefore, the bottom portions of the gate polysilicon layer 112 and the gate oxide layer 211 are dry-etched at a faster rate than the photoresist 120 such that a notched-shape gate electrode (see reference 210 of FIG. 8) is fabricated.

In other words, while performing the dry etching process, portions of the bottom of the gate polysilicon layer 112 and the gate oxide layer 211 are dry-etched by an etching chemical mixture including an oxygen ion $O^{2-}$, $O^-$ or $O^*$. As a result, the notched gate electrode (see reference 210 of FIG. 8) is fabricated. The dry etching process may comprise, for example, a plasma etching process applying an etching chemical mixture including a fluorine ion $F^-$ or $F^*$. Additionally, various etching chemical mixtures having a selectivity ratio to the gate oxide layer 211 can be applied in the dry etching process. Such etching chemical mixtures can be applied during multiple steps of the dry etching process.

The notched gate electrode (see reference 210 of FIG. 8) can have various lengths according to the etching time duration. It is preferable that the length of the bottom of the gate polysilicon layer 212 is about 5 to 50% of the length of the top of the gate polysilicon layer 212

Figure 5:
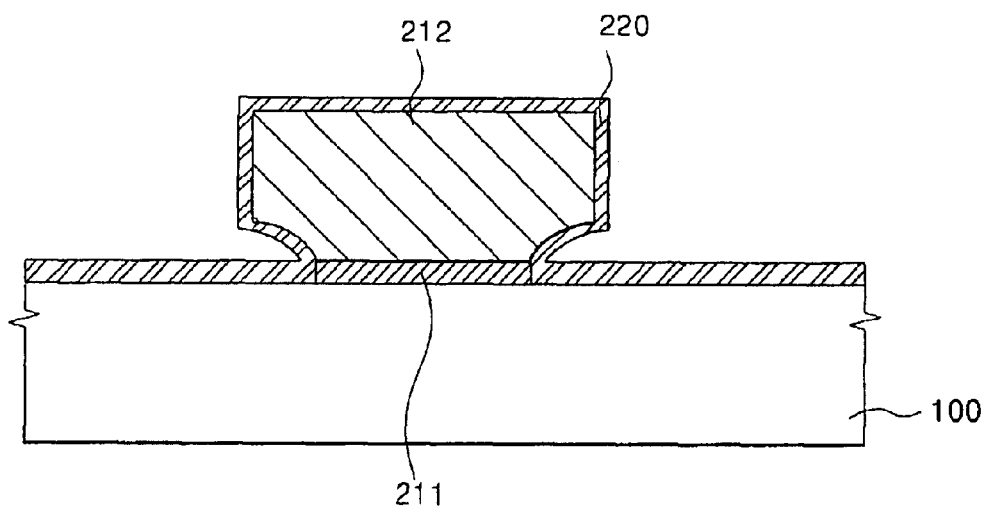

Referring to FIG. 5, in order to prevent plasma etching damage to the resulting notched gate electrode (see reference 210 of FIG. 8), a gate poly oxide layer 220 is provided over the structure. The gate poly oxide layer 220 is used as a mask for the subsequent processes, including, for example, an oxide layer growing process or an ion implanting process.

Figure 6:
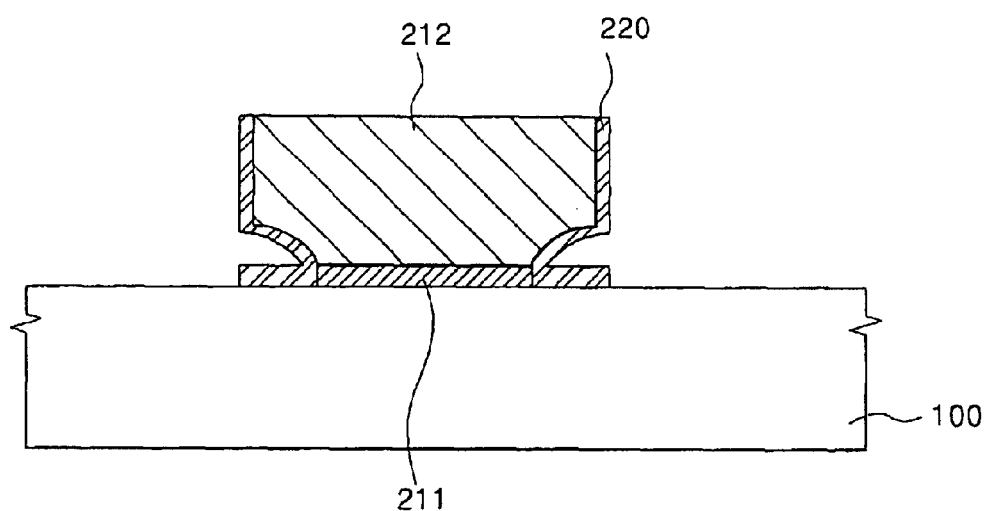

As described above, in conventional fabrication technology, an ion implanting process to the source/drain region would be performed at this stage. However, as shown in FIG. 6, the process of the present invention first removes a portion of the gate poly oxide layer 220 except in the region near the bottom of the gate polysilicon layer 212

Figure 7:
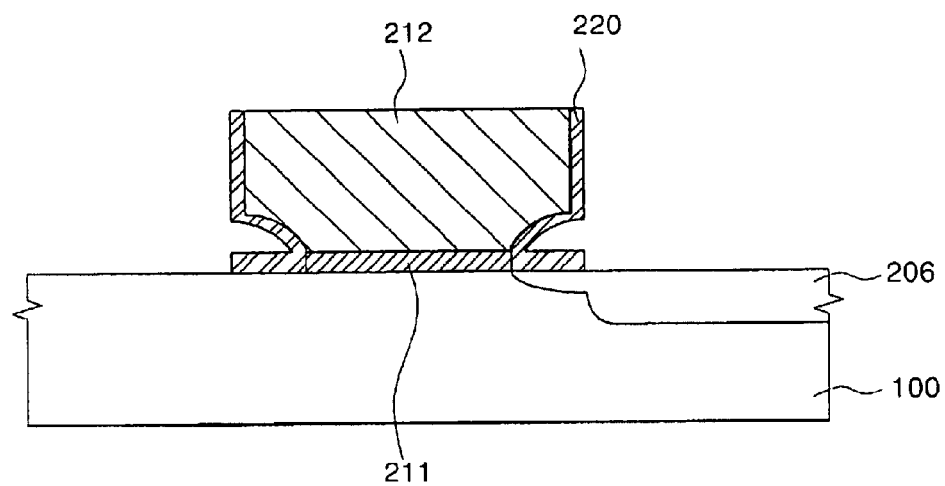

Next, in order to prevent the short channel effect SCE phenomenon, an ion implanting process with low energy is employed in order to fabricate a lightly doped drain LDD ($N^-$ or $P^-$) region according to standard LDD processes. As shown in FIG. 7, the LDD region 206 is thereby fabricated on the silicon substrate 100. Such a structure has no gate poly oxide layer 220 in the portion of the ion implanting region such that the ion implanting process with low energy can readily form a shallow junction. Additionally, the gate poly oxide layer 220 resides in the bottom portion of the gate polysilicon layer 212 such that the reliability of the gate polysilicon layer 212 is maintained.

After fabricating the LDD region 206, a gate spacer 213 is formed according to conventional techniques. The gate spacer 213 may comprise, for example, a silicon nitride layer or a silicon oxide layer.

Figure 8:
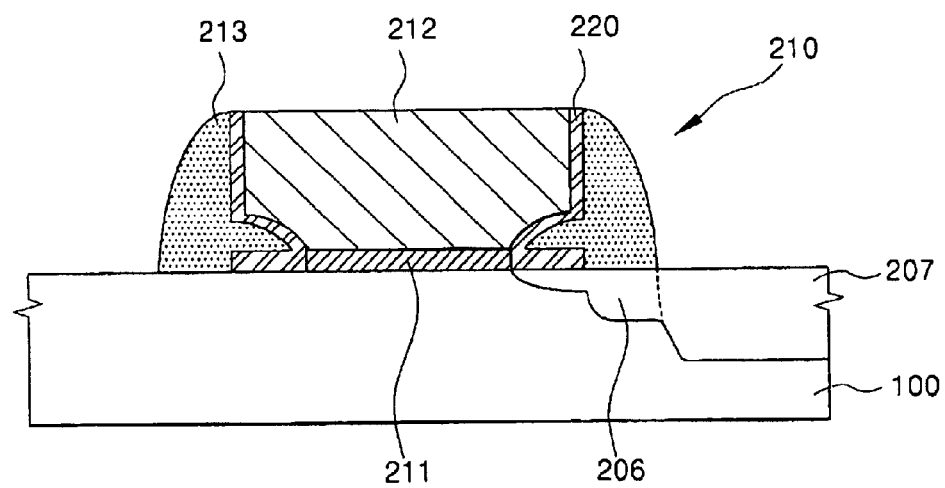

After forming the gate spacer 213, a standard ion implanting process for a deep source/drain (N+ or P+) region forms a doping region 207. Therefore, as shown in FIG. 8, a semiconductor device is fabricated to have a doped region including three steps, namely a first step 205 under the gate poly oxide layer 220, a second step formed of the LDD region 206, and a third step formed of the deep source/drain doping region 207.

As described above, the doped region of three steps 205, 206, 207 reduces overall resistance of the entire junction due to an increase in the size of the doped region, and mitigates short channel effect SCE due to an increase in the size of the LDD region, as compared to the conventional device.

The above-described semiconductor device and method of fabricating a semiconductor device is applicable to transistors or fabrication of transistors having a pattern size of less than 1 μm. in a preferred embodiment, such transistors are formed on a substrate having a silicon-on-insulator SOI structure.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor device comprising:
    a silicon substrate;
    a source/drain region formed in the substrate including a lightly doped region and an adjacent heavily doped region, the depth of the heavily doped region being greater than the depth of the lightly doped region;
    a gate oxide layer on the silicon substrate; and
    a notched gate electrode on the substrate, the notched gate electrode including a notch along an outer side surface of a lower portion such that a top portion of the notched gate electrode is wider than the lower portion, the gate oxide layer extending between the interface of the notched gate electrode and the substrate, and a gate poly oxide layer provided along an outer side surface of the notched gate electrode and along an inner wall of the notch, a portion of the lightly doped region being under the notch,
    wherein a width of the lower portion of the gate electrode is in the range of about 5 to 50% of a width of the top portion of the gate electrode.

2. The semiconductor device according to claim 1 further comprising a gate spacer adjacent the gate poly oxide layer of the notched gate electrode.

3. The semiconductor device according to claim 2 wherein an interface of the lightly doped region and the heavily doped region is positioned under an outer edge of the spacer.

4. The semiconductor device according to claim 1 wherein the notched gate electrode is formed of gate polysilicon.

5. The semiconductor device according to claim 1 wherein the lightly doped region extends to a location under the outer side surface of the top portion of the gate electrode.

6. The semiconductor device according to claim 1 wherein the lightly doped region extends under the notch.

7. The semiconductor device according to claim 1, wherein the gate oxide layer comprises silicon oxide $SiO_2$, silicon nitro-oxide $SiN_xO_y$, zirconium oxide $ZrO_2$, hafnium oxide $HfO_2$, tantalum oxide $Ta_2O_5$, or aluminum oxide $Al_2O_3$.

8. The semiconductor device according to claim 1, wherein the gate oxide layer comprises a silicon nitride layer $Si_3N_4$ or a silicon oxi-nitride layer $SiO_xN_y$.

9. The semiconductor device according to claim 1 used for forming a transistor having a pattern size of less than 1 μm.

10. The semiconductor device according to claim 1, wherein the substrate is formed on a silicon on insulator SOI structure.

11. A method of fabricating a semiconductor device, comprising the steps of:
    sequentially providing a gate oxide layer and a gate polysilicon layer on a silicon substrate;
    etching a notched gate electrode in the gate polysilicon layer by applying an etching condition so as to increase a selectivity ratio in the gate oxide layer, the notched gate electrode including a notch along an outer side surface of a lower portion such that a top portion of the notched gate electrode is wider than the lower portion;
    providing a gate poly oxide layer on the top portion and outer side surface of the notched gate electrode and on the substrate;
    removing a portion of the gate poly oxide layer except for a portion of the outer side surface in the region of the notch;
    forming a lightly doped drain LDD region by applying a low energy first ion implanting process;
    forming a gate spacer adjacent the gate poly oxide layer; and
    forming a deeply doped region by applying a second ion implanting process to provide a deep source/drain region,
    wherein a width of the lower portion of the gate electrode is in the range of about 5 to 50% of a width of the top portion of the gate electrode.

12. The method of fabricating a semiconductor device according to claim 11, wherein the gate oxide layer comprises silicon oxide $SiO_2$, silicon nitro-oxide $SiN_xO_y$, zirconium oxide $ZrO_2$, hafnium oxide $HfO_2$, tantalum oxide $Ta_2O_5$, or aluminum oxide $Al_2O_3$.

13. The method of fabricating a semiconductor device according to claim 11, wherein the gate oxide layer comprises silicon nitride $Si_3N_4$ or silicon oxi-nitride $SiO_xN_y$.

14. The method of fabricating a semiconductor device according to claim 11 used for forming a transistor having a pattern size of less than 1 μm.

15. The method of fabricating a semiconductor device according to claim 11, wherein the substrate is formed on a silicon on insulator SOI structure.

16. The method of fabricating a semiconductor device according to claim 11, wherein an etching condition adjustment is performed by partitioning the step of etching into a plurality of etching steps.

17. The method of fabricating a semiconductor device according to claim 16, wherein each of the plurality of etching steps employs different etching chemical mixtures to form the notched gate electrode.

18. The method of fabricating a semiconductor device according to claim 17, wherein portions of the lower portion of the gate electrode and the gate oxide layer are dry-etched by an etching chemical mixture including an oxygen ion $O^{2-}$, $O^-$ or $O^*$.

19. A method of fabricating a semiconductor device, comprising the steps of:
    sequentially providing a gate oxide layer and a gate polysilicon layer on a silicon substrate;
    etching a notched gate electrode in the gate polysilicon layer by applying an etching condition so as to increase a selectivity ratio in the gate oxide layer, the notched gate electrode including a notch along an outer side surface of a lower portion such that a top portion of the notched gate electrode is wider than the lower portion;

providing a gate poly oxide layer on the top portion and outer side surface of the notched gate electrode and on the substrate;

removing a portion of the gate poly oxide layer except for a portion of the outer side surface in the region of the notch;

forming a lightly doped drain LDD region by applying a low energy first ion implanting process;

forming a gate spacer adjacent the gate poly oxide layer; and forming a deeply doped region by applying a second ion implanting process to provide a deep source/drain region, wherein the semiconductor device comprises a transistor having a pattern size of less than 1 $\mu$m.

* * * * *